United States Patent
Chuang

(10) Patent No.: US 10,014,206 B1
(45) Date of Patent: Jul. 3, 2018

(54) TRENCH ISOLATED IC WITH TRANSISTORS HAVING LOCOS GATE DIELECTRIC

(71) Applicant: Texas Instruments Incorporated, Dallas, TX (US)

(72) Inventor: Ming-Yeh Chuang, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/380,505

(22) Filed: Dec. 15, 2016

(51) Int. Cl.
| | |
|---|---|
| *H01L 29/66* | (2006.01) |
| *H01L 21/762* | (2006.01) |
| *H01L 21/761* | (2006.01) |
| *H01L 29/78* | (2006.01) |
| *H01L 29/40* | (2006.01) |
| *H01L 29/06* | (2006.01) |
| *H01L 29/10* | (2006.01) |

(52) U.S. Cl.
CPC ...... *H01L 21/76202* (2013.01); *H01L 21/761* (2013.01); *H01L 21/762* (2013.01); *H01L 29/0623* (2013.01); *H01L 29/0696* (2013.01); *H01L 29/1095* (2013.01); *H01L 29/408* (2013.01); *H01L 29/66681* (2013.01); *H01L 29/7823* (2013.01)

(58) Field of Classification Search
CPC ............. H01L 21/762; H01L 21/76202; H01L 21/76208
USPC .......................................................... 257/343
See application file for complete search history.

(56) References Cited

U.S. PATENT DOCUMENTS

| | | | |
|---|---|---|---|
| 6,140,189 A | 10/2000 | Hsu et al. | |
| 7,005,354 B2 * | 2/2006 | Pan ..................... | H01L 29/1033 257/E21.427 |
| 2011/0024838 A1 * | 2/2011 | Kitazawa .......... | H01L 29/42364 257/337 |
| 2012/0100679 A1 | 4/2012 | Sridhar et al. | |
| 2013/0087828 A1 * | 4/2013 | Koshimizu ....... | H01L 21/82385 257/139 |
| 2014/0070315 A1 * | 3/2014 | Levy ................... | H01L 29/0634 257/343 |

* cited by examiner

*Primary Examiner* — David Vu
*Assistant Examiner* — Brandon Fox
(74) *Attorney, Agent, or Firm* — Andrew R. Ralston; Charles A. Brill; Frank D. Cimino

(57) ABSTRACT

An integrated circuit (IC) including at least one transistor having a metal-oxide-semiconductor (MOS) gate includes a substrate having a semiconductor surface. The transistor includes at least one trench isolation region in the semiconductor surface. Local oxidation of silicon (LOCOS) regions extend from within the semiconductor surface inside the trench isolation region defining a first LOCOS-free region and at least a second LOCOS-free region. A gate electrode is between the first LOCOS-free region and second LOCOS-free region including over a flat portion of a first of the LOCOS regions as its gate dielectric (LOCOS gate oxide). A first doped region is in the first LOCOS-free region and a second doped region is in the second LOCOS-free region on respective sides of the gate electrode both doped a first dopant type. A recessed channel region for the transistor is between the first and second doped regions under the LOCOS gate oxide.

20 Claims, 5 Drawing Sheets

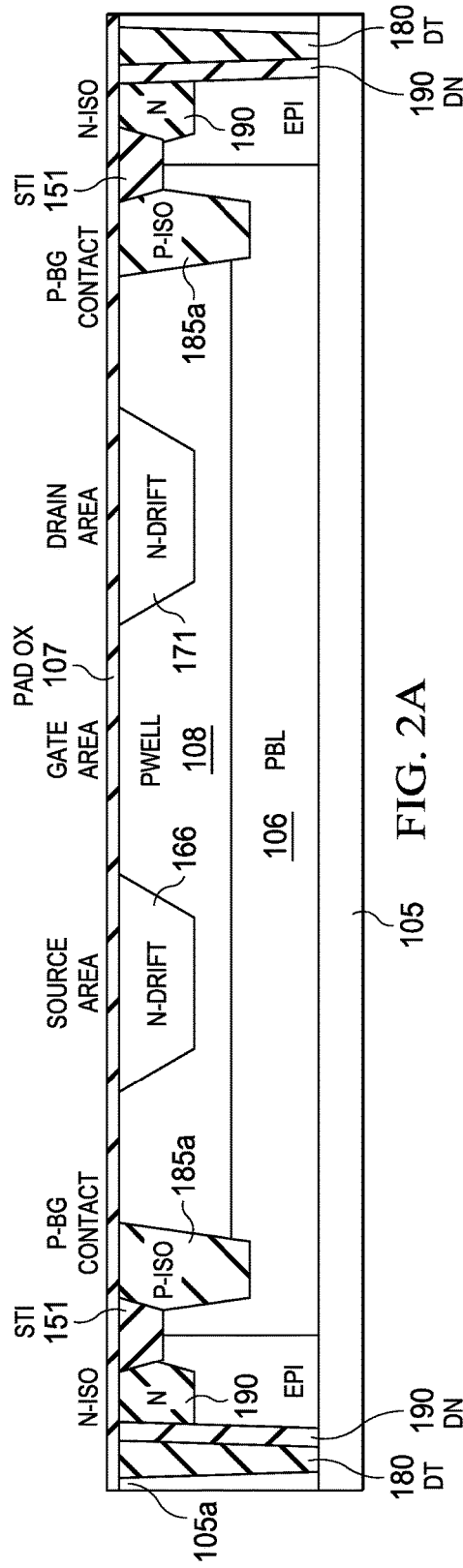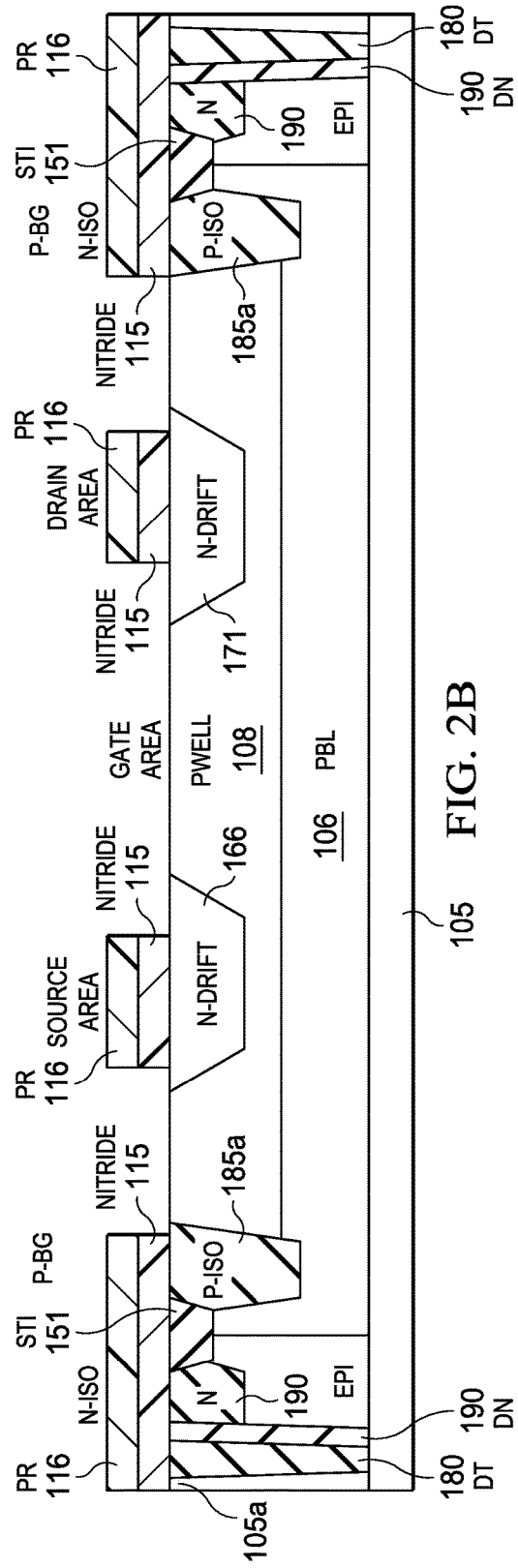
FIG. 2A
FIG. 2B

TRENCH ISOLATED IC WITH TRANSISTORS HAVING LOCOS GATE DIELECTRIC

FIELD

Disclosed embodiments relate to integrated circuits (ICs). More particularly, disclosed embodiments relate to transistors including metal oxide semiconductor (MOS) gates and ICs including such transistors.

BACKGROUND

ICs generally include an isolation structure for electrically isolating devices from one another. Isolation options include trench isolation (e.g., Shallow Trench Isolation (STI)) or Local Oxidation of Silicon (LOCOS).

For LOCOS processing a thin silicon oxide layer is thermally grown on the wafer surface, generally called a pad oxide. A layer of silicon nitride is then deposited which is used as an oxide barrier. The pattern transfer is performed by photolithography. A lithography pattern is then etched into the silicon nitride. The result is a silicon nitride hard mask, which has openings that define the active areas defined by the LOCOS process.

The next step is the growth of the thermal LOCOS oxide which is termed a field oxide (FOX) as it is selectively grown in all non-active regions. After this LOCOS process is finished, the last step is the removal of the silicon nitride layer and the pad oxide layer underneath. A drawback of the LOCOS technique is the so-called bird's beak effect and the surface area which is lost due to this encroachment. Advantages of LOCOS fabrication include a simple process flow and the high FOX layer quality because the entire LOCOS structure is thermally grown.

STI is generally a preferred isolation technique for the sub-0.5 µm IC technology, because it avoids the bird's beak shape characteristic. With its zero oxide field encroachment STI is more suitable for the increased IC density requirements, as it enables forming smaller area isolation regions.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize for certain ICs having metal-oxide-semiconductor (MOS) gates, such those having a double or triple gate process for high voltage (HV) gate applications, it is difficult to integrate into a shallow trench isolation (STI) technology for device isolation using conventional MOS field effect transistor (MOSFET) structures. That is why HV MOSFETs in known technologies generally use LOCOS for device isolation. When STI is used for HV MOSFET device isolation, the gate dielectric (e.g., gate oxide) of the MOSFET is merged with STI. Because the conventional polysilicon gate electrode is over both the gate dielectric and the STI and thus over their interface a problem is recognized to arise from gate dielectric etches needed to remove non-needed gate and dummy dielectrics (e.g., oxides), as well as a slower silicon oxide growth rate along the STI edges to the active area. Gate dielectrics at the edges of STI are thus significantly thinner than elsewhere in the active area, and therefore generally degrade the transistor's gate oxide integrity (GOI).

Disclosed ICs include STI for device isolation and transistors having MOS gate structures described herein using a LOCOS dielectric as the gate oxide, where the LOCOS gate oxide is spaced apart from the STI, such as within an STI ring. Disclosed MOS gate structures have the transistor gate electrode sitting on top of the LOCOS gate oxide layer throughout its area, that thus generally has a constant gate oxide thickness throughout. As a result, there is no conventional GOI issue at the STI edge with the active area. This disclosed arrangement allows relatively simple MOS gate structures including HV gate MOSFET structures that can be readily integrated into STI-based technologies without the above-described GOI problem.

BRIEF DESCRIPTION OF THE DRAWINGS

Reference will now be made to the accompanying drawings, which are not necessarily drawn to scale, wherein:

FIGS. 2A-2E are successive are cross-sectional diagrams showing processing progression for an example method of forming an example trench isolated IC having transistors with MOS gates that use LOCOS as their gate dielectric, according to an example embodiment.

DETAILED DESCRIPTION

Figure 1:
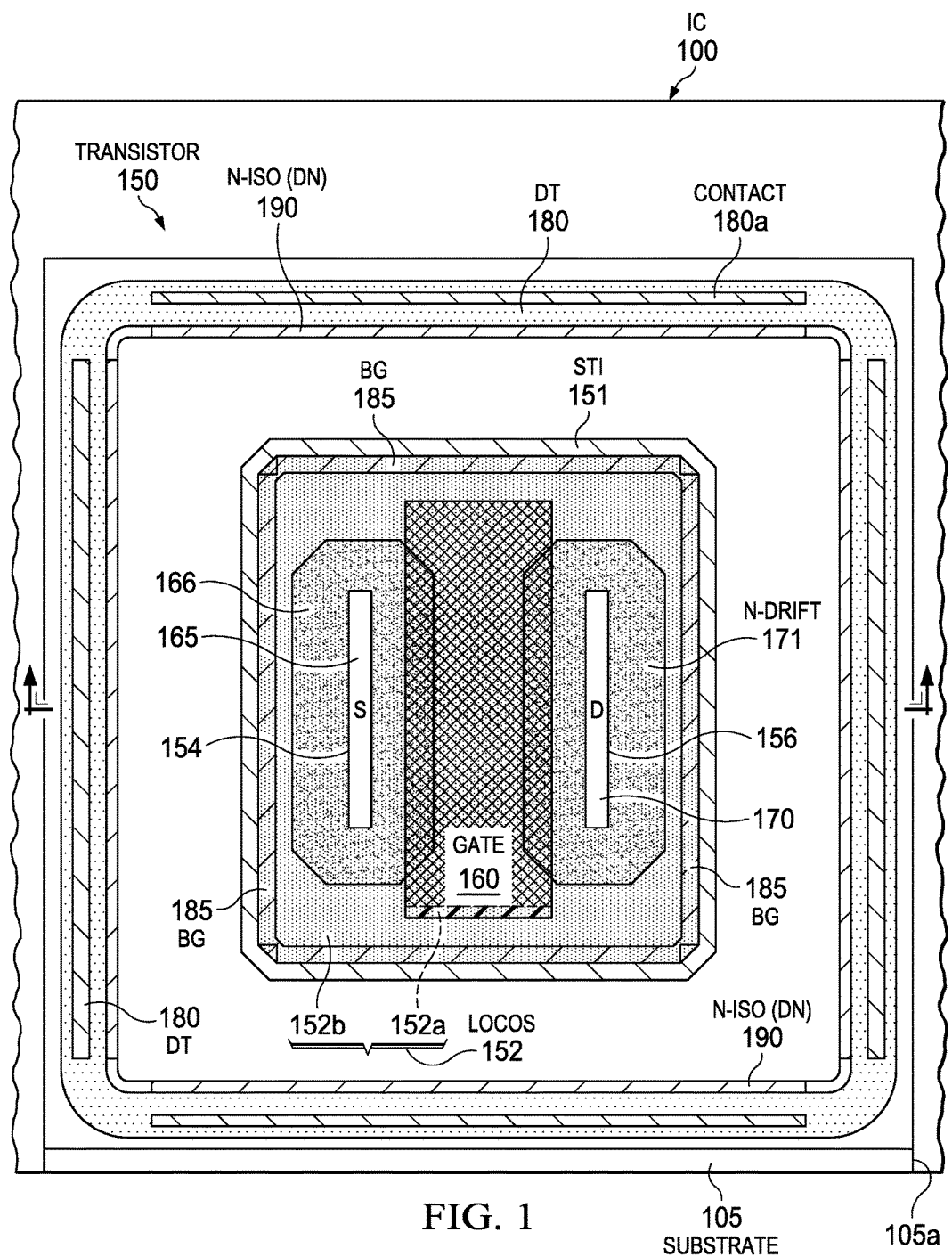
FIG. 1 is a top view of an example trench isolated symmetric n-channel drain extended MOS (DENMOS) device, where the DENMOS device uses LOCOS as its gate dielectric, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1 is a top view of an example IC 100 including a trench isolated symmetric transistor 150 having a MOS gate structure that uses LOCOS as its gate oxide which is shown by example as a DENMOS transistor. Disclosed transistors can comprise a HV MOSFET that can generally be any MOSFET style controlled by a gate, or can be an Insulated Gate Bipolar Transistor (IGBT) which are known to be a semiconductor device having four alternating doped layers (P—N—P—N) that are controlled by a MOS gate structure without regenerative action. The HV MOS transistor can comprise a symmetric or asymmetric extended-drain MOS transistor such as a drain extended metal oxide semiconductor (DEMOS), Double-Diffused MOS (DMOS), Lateral Double-Diffused MOS (LDMOS) or Double-Diffused Drain MOS (DDDMOS). Each of these HV device types can utilize an extended drain structure and its gate electrode (e.g., polysilicon) can be across the gate dielectric over the active area to STI interface.

High voltage as used herein can mean high gate voltage, high drain voltage, or both, with high voltage being >20V. LOCOS as the gate dielectric is recognized to be particularly well suited for high voltage applications. Although NMOS transistors are generally described herein, it is clear to one having ordinary skill in the art to use this information to form PMOS transistors, by n-doped regions being substituted by p-doping and vice versa. The section horizontal line with its endpoints only shown (with arrows) in FIG. 1 corresponds to the cross sectional view in FIG. 2E described below. The IC 100 can comprises an analog IC, such as a power converter in one particular application, or a BiCMOS IC.

The IC comprises a substrate 105 having a semiconductor surface 105a. The substrate 105 and/or semiconductor surface 105a can comprise silicon, silicon-germanium, or other semiconductor material. One particular arrangement is a silicon epitaxial layer on a bulk silicon substrate 105, such as a 5 µm to 15 µm thick p-epi layer on a p+ substrate. The transistor 150 includes at least one trench isolation region shown as STI 151 being in an encircling ring formed (e.g., by Reactive Ion Etching (RIE)) within the semiconductor surface 105a. STI 151 is at least partially dielectric lined and can be entirely dielectric filled, or be dielectric lined and polysilicon filled. There is LOCOS 152 in the semiconductor surface 105a inside the trench isolation 151 including LOCOS gate oxide 152a (under gate electrode 160) and LOCOS isolation (ISO) 152b that defines boundaries for a first LOCOS-free region 154 that has a source (S) 165 within and at least a second LOCOS-free region 156 that has a drain (D) 170 within, are both shown in FIG. 1.

Figure 2C:
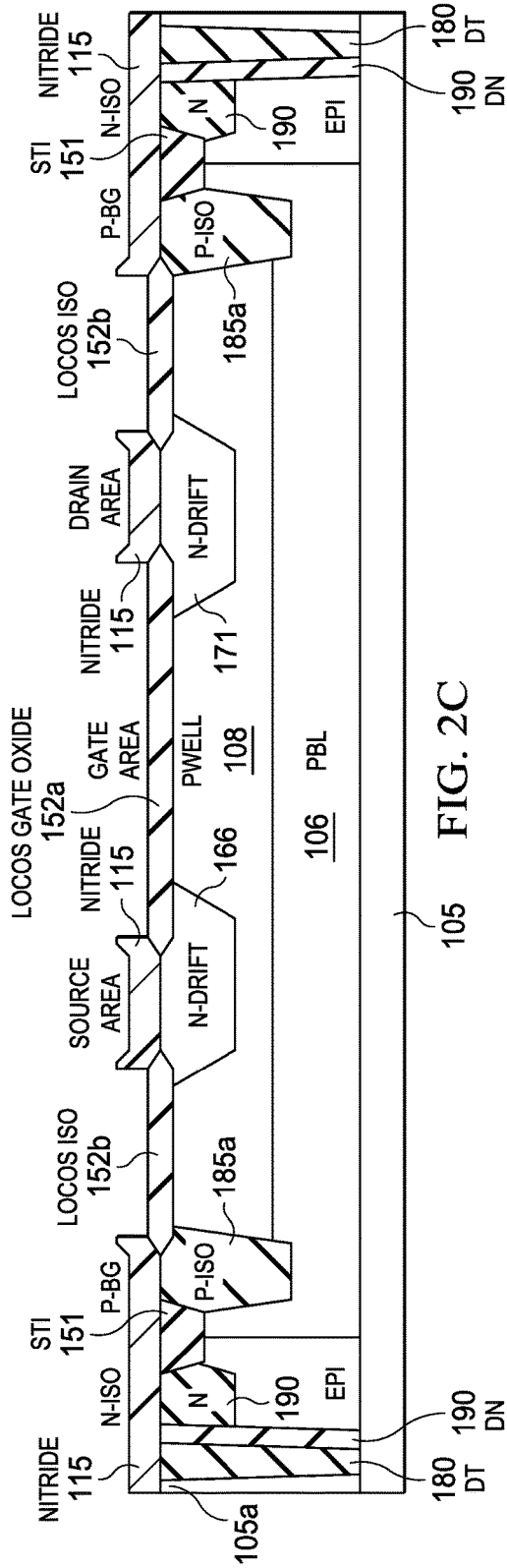
Figure 2D:
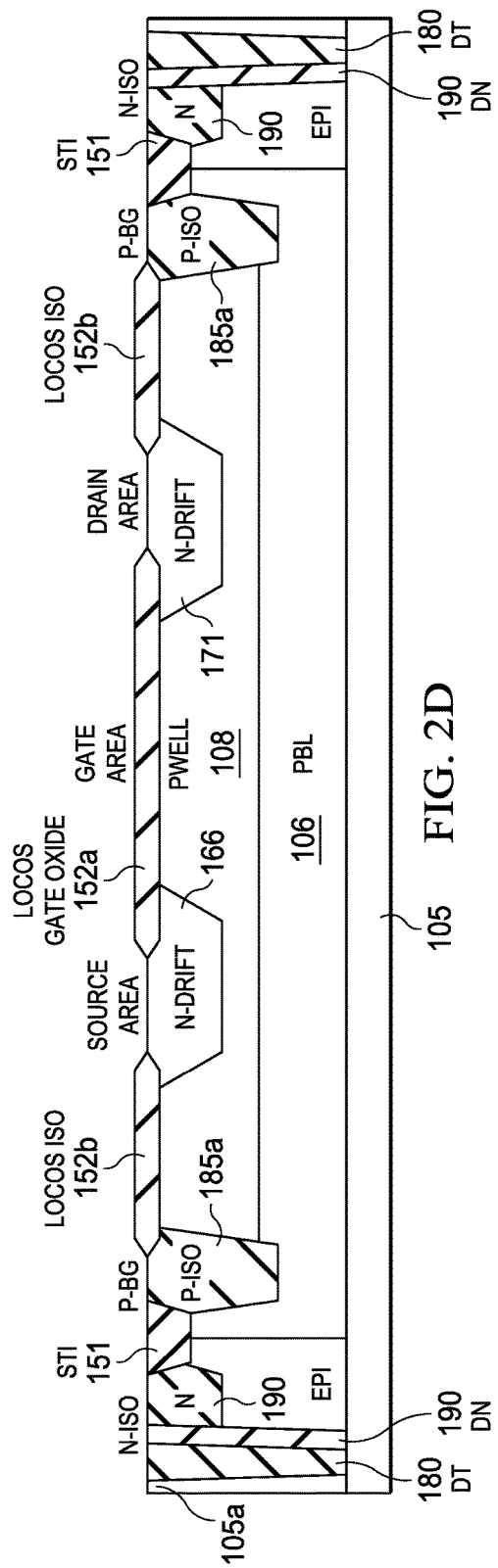
Figure 2E:
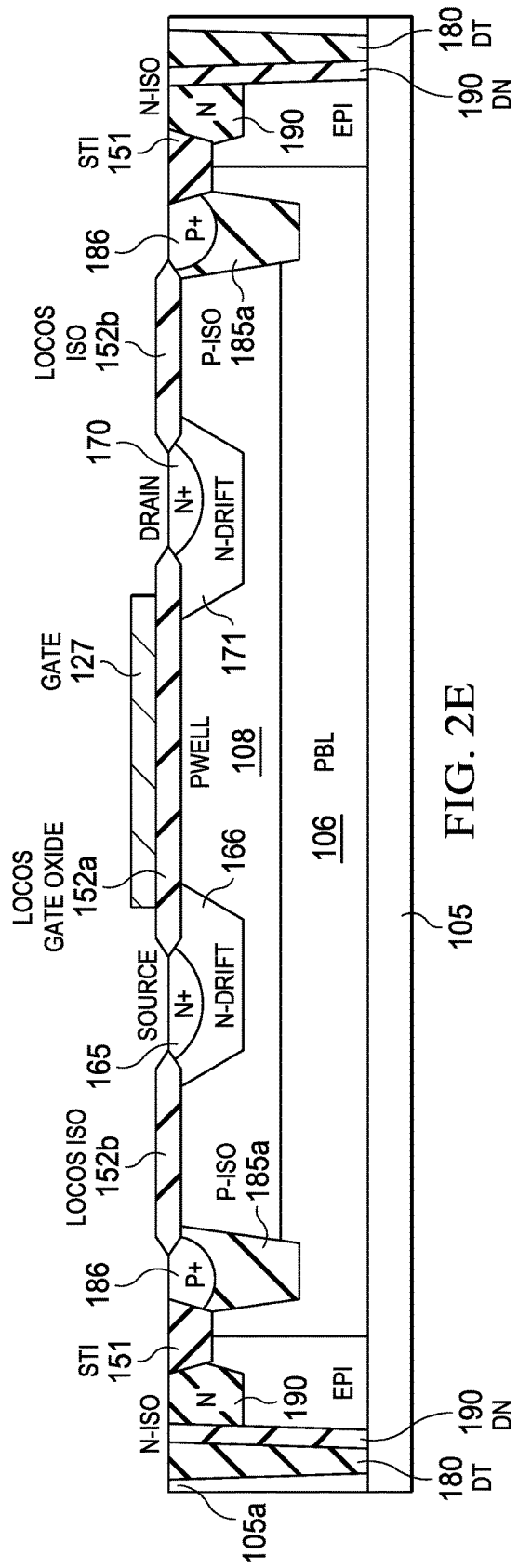

A gate electrode 160 is between the first LOCOS-free region 154 and second LOCOS-free region 156 including over a flat (planar) portion of the LOCOS gate oxide 152a shown in FIGS. 2C-2E. The entire area of the gate electrode 160 can be seen to never be over any edge of the STI 151.

As noted above the transistor 150 is shown including a first doped region shown as source 165 in the first LOCOS-free region 154 and a second doped region shown as drain 170 in the second LOCOS-free region 156, thus being on respective sides of the gate electrode 160. For a NMOS transistor such as a DENMOS transistor, the source and drain are both doped n-type (n+ doped). Being a DENMOS transistor the second doped region 170 is formed within an n-drift region 171 and the first doped region 165 is optionally formed within an n-drift region 166.

The transistor 150 is shown also including deep trench (DT) isolation 180 that is shown including an inner doped semiconductor region having a surface contact 180a for biasing, such as when it includes a polysilicon filler, and a deep n-type isolation (DN) 190 between the DT isolation 180 and the STI 151. There is also a LOCOS-free transition region located between the LOCOS regions and the STI 151 which comprises a back-gate (BG) ring 185 which is doped the second dopant type (p-type for NMOS) to provide ohmic contact to a p-buried layer (PBL) that is under the transistor 150 (see PBL 106 in FIGS. 2A-2E described below).

FIGS. 2A-2E are successive are cross-sectional diagrams showing processing progression for an example method of forming trench isolated IC having transistors with MOS gates that use LOCOS as their gate dielectric shown for forming the DENMOS transistor shown in FIG. 1. As noted above, disclosed methods integrate a MOS gate structure including a LOCOS gate oxide with both STI and DT.

The buried layer shown as PBL 106 in FIG. 2A is formed in the semiconductor surface 105a of the substrate 105 which is shown as a p-type epitaxial (epi) layer. In a typical PBL formation process, the thermal pad oxide 107 shown is grown, photoresist is deposited and patterned, a PBL mask is used to expose only PBL areas, and PBL areas are selectively formed by ion implantation. Wells shown as a pwell 108 and special purpose layers shown as p-iso 185a in FIG. 2A which contacts PBL 106 are for providing the BG 185 shown in FIG. 1, and n-drift regions 166 and 171 shown in FIG. 2A are also formed. STI 151, DT 180 and n-iso (DN) 190 shown in FIG. 2A are also formed.

FIG. 2B depicts the in-process IC after silicon nitride patterning and etching. After growing a thin silicon oxide (e.g., 10 nm to 20 nm thick) shown as thermal pad oxide 107 in FIG. 2A but for simplicity no longer shown in FIG. 2B, a layer of Low Pressure Chemical Vapor Deposition (LPCVD) silicon nitride of about 100 nm to 200 nm is generally deposited thereon. A PR patterned layer 116 is formed on the silicon nitride layer, and the silicon nitride layer is etched in exposed areas defined by the PR pattern to define a patterned silicon nitride layer 115 having openings where LOCOS is to grow. The patterned silicon nitride layer 115 can be seen to be over STI 151, the source area and drain area, and over the DT 180. STI 151 and DT 180 are thus protected during the LOCOS process by the silicon nitride layer 115 that is over these regions.

FIG. 2C depicts the in-process IC after the PR patterned layer 116 is removed and the LOCOS layer is grown to provide LOCOS gate oxide 152a and LOCOS isolation 152b. During the LOCOS growth process the silicon nitride layer 115 hard mask selectively blocks LOCOS growth. The STI 151 is shown separated from the LOCOS regions. However, although not shown the STI or other trench isolation can also be merged it so that it can overlap with the LOCOS.

The LOCOS process is generally a thermal steam oxidation process at temperatures above 950° C. to allow stress-relief by viscous flow of the LOCOS oxide. A wet LOCOS process has faster throughput than a dry oxide process and is of generally good quality. LOCOS forms in only the MOSFET active region that is inside the STI 151 ring. LOCOS gate oxide 152a is between the n-drift 166 and n-drift 171 and LOCOS isolation 152b is between the n-drift 166 and 171 and the p-iso 185a. As a HV gate oxide, the LOCOS gate oxide 152a may be 500 Å to 3000 Å, such as about 1350 Å for 48V circuit applications.

FIG. 2D shows the resulting in-process IC after stripping of the silicon nitride layer 115 shown in FIG. 2C. The silicon nitride layer 115 can be stripped in hot (e.g., 150 to 175° C.) $H_3PO_4$ (phosphoric acid), and the pad oxide underneath the silicon nitride can be removed in a buffered HF solution.

LOCOS regions such as shown in FIGS. 2C to 2E have the known distinctive 'bird's beak' along their periphery. The bird's beak results because as the silicon oxide grows, the conventional silicon nitride hard mask, which is used to block the silicon oxide from growing everywhere, is slightly bent due to stress caused by the growing silicon oxide pushing the silicon nitride as it grows.

FIG. 2E depicts the in-process IC after gate electrode formation. The gate electrode is shown as 127. The gate formation process generally comprises a gate electrode deposition, photoresist deposition and patterning, and then etching the gate electrode in exposed areas of the pattern. The gate electrode 127 locates on the LOCOS gate oxide 152a which is a flat region that is away from the STI 151 so that the gate electrode is never over an STI/active area edge. There is thus no gate dielectric thinning as there is no STI edge and thus no GOI problem for the MOS gate because LOCOS grows locally. The LOCOS gate oxide 152a is also protected by the gate electrode 127 during the gate electrode etch. There is no need to remove LOCOS later in other areas and therefore avoided is excess oxide deglazes over the STI 151 and DT 180.

As seen in FIG. 2E the in-process transistor has a recessed channel region in semiconductor surface 105a being under the LOCOS gate oxide 152a. P-source and drain (PSD) and NSD steps are included forming NSD areas shown as N+ source 165 and N+ drain 170 and P+ region 186 for contact to p-iso 185a to provide the BG 185 shown in FIG. 1. A p-MOSFET structure would use essentially the same above-described process steps using complementary doping for forming a p-MOSFET structure.

For simplicity, not shown in FIG. 2E are conventional subsequently formed contacts to the semiconductor surface, metal 1, ILD, vias, metal 2, etc., a bond pad layer, or a passivation layer. Also not described are conventional channel implant(s) to adjust the threshold voltages, surface implant(s) to increase the breakdown voltage, as well as spacers and lightly-doped drains (LDD) that may also be present.

Figure 3:
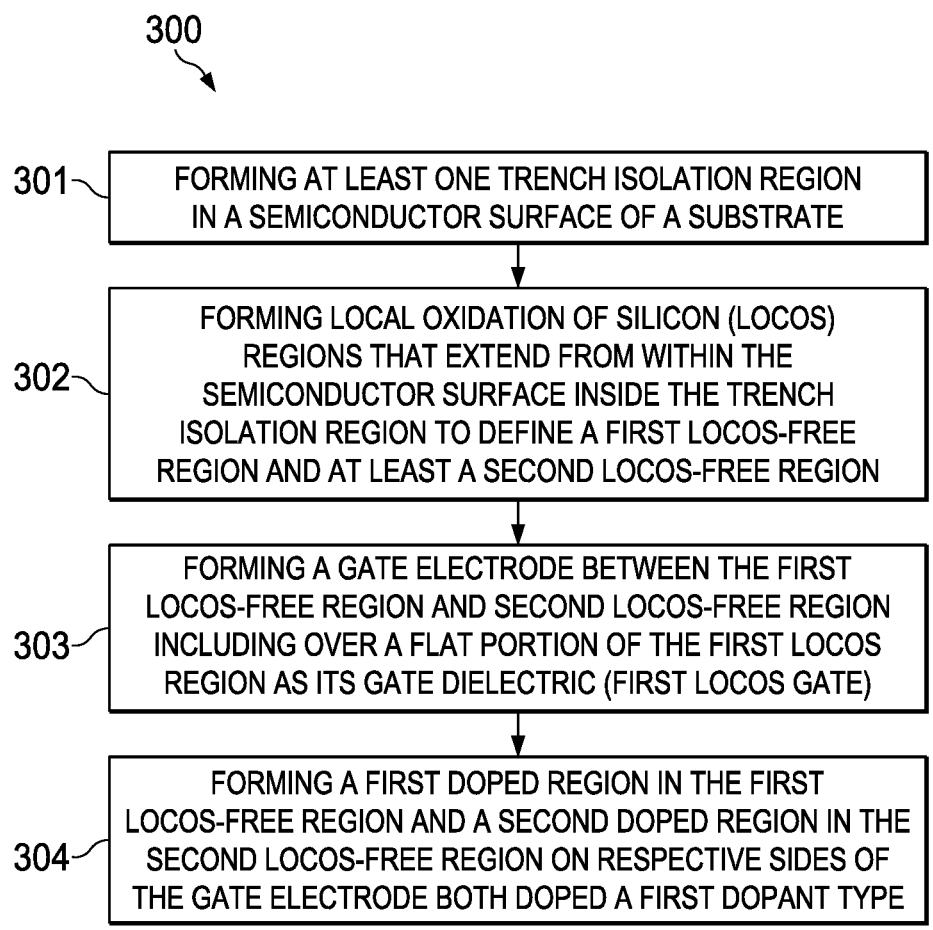
FIG. 3 is a flow chart that shows steps in an example method for forming a transistor including a MOS gate that uses LOCOS as its gate dielectric, according to an example embodiment.

FIG. 3 is a flow chart that shows steps in an example method 300 for forming a transistor including a MOS gate that uses LOCOS as its gate dielectric within an IC. Step 301 comprises forming at least one trench isolation region in a semiconductor surface of a substrate. As noted above in some embodiments the substrate comprises silicon, such as silicon epi on bulk silicon. Step 302 comprises forming LOCOS regions that extend from within the semiconductor surface inside the trench isolation to define a first LOCOS-free region and at least a second LOCOS-free region. The thickness of the LOCOS regions can be from 600 Å to 2500 Å.

Step 303 comprises forming a gate electrode between the LOCOS-free region and second LOCOS-free region including over a flat portion of a first LOCOS region as its gate dielectric (LOCOS gate oxide). The gate electrode can be formed by LPCVD and comprise polysilicon or a metal (or metal alloy) material.

Step 304 comprises forming a first doped region (e.g., source region) in the first LOCOS-free region and a second doped region (e.g., drain region) in the second LOCOS-free region on respective sides of the gate electrode both doped a first dopant type (e.g, n-type for NMOS). A recessed channel region for the transistor is between first doped region and second doped region in semiconductor surface under the LOCOS gate oxide.

Advantages of disclosed embodiments include processing using mature LOCOS and STI technologies. Using STI for isolation provides a better digital density compared to LOCOS isolation. The new disclosed device structures will not have GOI issue for both low voltage (LV) and HV gate transistors such as MOSFET's.

Disclosed embodiments can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method of forming a transistor having a metal-oxide-semiconductor (MOS) gate within an integrated circuit, comprising:
   forming at least one trench isolation region in a semiconductor surface of a substrate, the trench isolation region including a well doped a first dopant type;
   forming local oxidation of silicon (LOCOS) regions extending from within said semiconductor surface inside said trench isolation region to define a first LOCOS-free region and at least a second LOCOS-free region;
   forming a gate electrode between said first LOCOS-free region and said second LOCOS-free region positioned entirely over a flat portion of a first of said LOCOS regions, the flat portion being a gate dielectric (LOCOS gate oxide), and
   forming within said well a first doped region in said first LOCOS-free region and a second doped region in said second LOCOS-free region on respective sides of said gate electrode, the first and second doped regions both doped a second different dopant type,
   wherein a recessed channel region for said transistor is between said first doped region and said second doped region in said semiconductor surface under said LOCOS gate oxide.

2. The method of claim 1, wherein said gate electrode comprises polysilicon.

3. The method of claim 1, wherein said trench isolation regions are separated from said LOCOS regions.

4. The method of claim 1, wherein said trench isolation region is configured in a ring shape which encircles an active area of said transistor, and wherein a LOCOS-free transition region is located between said LOCOS regions and said trench isolation regions which comprises a back-gate (BG) ring doped said first dopant type.

5. The method of claim 1, wherein said LOCOS regions comprise silicon oxide and a thickness of said silicon oxide is from 600 Å to 2500 Å.

6. The method of claim 1, wherein said transistor comprises a MOS transistor.

7. The method of claim 6, wherein said MOS transistor comprises an extended-drain MOS transistor.

8. The method of claim 6, wherein said MOS transistor comprises an n-channel MOS transistor.

9. The method of claim 1, wherein the flat portion extends without interruption between the first and second doped regions.

10. The method of claim 1, wherein the gate electrode partially overlaps the first and second doped regions.

11. An integrated circuit (IC) including at least one transistor having a metal-oxide-semiconductor (MOS) gate, comprising:
   a substrate having a semiconductor surface,
   said transistor including:
      at least one trench isolation region in said semiconductor surface;

a well doped a first dopant type within said trench isolation region;

local oxidation of silicon (LOCOS) regions extending from within said semiconductor surface within said trench isolation region defining a first LOCOS-free region and at least a second LOCOS-free region;

a gate electrode between said first LOCOS-free region and said second LOCOS-free region positioned entirely over a flat portion of a first of said LOCOS regions, the flat portion being a gate dielectric (LOCOS gate oxide), and a first doped region in said first LOCOS-free region and a second doped region in said second LOCOS-free region on respective sides of said gate electrode, the first and second doped regions both located within the well and both doped a second different dopant type, wherein a recessed channel region for said transistor is between said first doped region and said second doped region in said semiconductor surface under said LOCOS gate oxide.

12. The IC of claim 11, wherein said gate electrode comprises polysilicon.

13. The IC of claim 11, wherein said trench isolation regions are separated from said LOCOS regions.

14. The IC of claim 11, wherein said trench isolation region is configured in a ring shape which encircles an active area of said transistor, and wherein a LOCOS-free transition region is located between said LOCOS regions and said trench isolation regions which comprises a Back-Gate (BG) ring doped said first dopant type.

15. The IC of claim 11, wherein said LOCOS regions comprise silicon oxide and a thickness of said silicon oxide is from 600 Å to 2500 Å.

16. The IC of claim 11, wherein said transistor comprises a MOS transistor.

17. The IC of claim 16, wherein said MOS transistor comprises an extended-drain MOS transistor.

18. The IC of claim 16, wherein said MOS transistor comprises an n-channel MOS transistor.

19. The IC of claim 11, wherein said IC comprises an analog IC.

20. The IC of claim 11, wherein the flat portion extends without interruption between the first and second doped regions.

* * * * *